US012813127B2

(12) United States Patent
Shi et al.

(10) Patent No.: US 12,813,127 B2
(45) Date of Patent: Nov. 24, 2026

(54) FLEXIBLE DISPLAY APPARATUS AND FABRICATION METHOD THEREOF

(71) Applicant: BOE TECHNOLOGY GROUP CO., LTD., Beijing (CN)

(72) Inventors: Yongxiang Shi, Beijing (CN); Paoming Tsai, Beijing (CN); Shiming Shi, Beijing (CN); Dejun Bu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 533 days.

(21) Appl. No.: 17/847,513

(22) Filed: Jun. 23, 2022

(65) Prior Publication Data

US 2022/0320475 A1 Oct. 6, 2022

Related U.S. Application Data

(63) Continuation-in-part of application No. 16/959,039, filed as application No. PCT/CN2019/101403 on Aug. 19, 2019, now abandoned.

(51) Int. Cl.

*H10K 59/40* (2023.01)
*H10K 59/80* (2023.01)
*H10K 102/00* (2023.01)

(52) U.S. Cl.

CPC ......... *H10K 59/40* (2023.02); *H10K 59/8791* (2023.02); *H10K 59/873* (2023.02); *H10K 2102/311* (2023.02)

(58) Field of Classification Search

CPC ...... H10K 50/868; H10K 59/40; H10K 71/00; H10K 2102/311; H10K 59/873; H10K 59/8791

See application file for complete search history.

(56) References Cited

U.S. PATENT DOCUMENTS 9,658,709 B2 5/2017 Hsu
9,665,225 B2 5/2017 Hsu
(Continued)

FOREIGN PATENT DOCUMENTS

CN 106486016 3/2017
CN 107393422 11/2017
(Continued)

OTHER PUBLICATIONS

Advisory Action for related U.S. Appl. No. 16/959,039, dated May 26, 2022.

(Continued)

*Primary Examiner* — Bitew A Dinke
(74) *Attorney, Agent, or Firm* — LEASON ELLIS LLP

(57) ABSTRACT

A flexible display apparatus and a fabrication method thereof are provided. The flexible display apparatus includes a display panel and a cover plate layer located on a display side of the display panel. The cover plate layer includes a first cover plate layer and a second cover plate layer stacked; the second cover plate layer is located on a side of the first cover plate layer that is closer to the display panel; the first cover plate layer includes a first flexible cover plate layer and a hardened layer located on a side of the first flexible cover plate layer that is away from the display panel; and the second cover plate layer includes a second flexible cover plate layer, and a material of the second flexible cover plate layer includes glass.

20 Claims, 3 Drawing Sheets

(56) References Cited

U.S. PATENT DOCUMENTS

| | | | | |
|---|---|---|---|---|
| 10,541,280 | B1 * | 1/2020 | Krah | G06F 3/04186 |
| 10,632,711 | B2 | 4/2020 | Lee | |
| 10,782,809 | B2 | 9/2020 | Schwartz | |
| 2009/0207151 | A1 * | 8/2009 | Liu | G06F 3/041 345/174 |
| 2009/0322705 | A1 * | 12/2009 | Halsey, IV | H03K 17/9622 29/829 |
| 2012/0242600 | A1 | 9/2012 | Chiou et al. | |
| 2014/0054145 | A1 * | 2/2014 | Chi | H01H 9/18 29/622 |
| 2014/0204286 | A1 * | 7/2014 | Park | G06F 3/04164 349/12 |
| 2015/0060827 | A1 * | 3/2015 | Sasaki | H10K 59/38 257/40 |
| 2015/0301400 | A1 * | 10/2015 | Kimura | H04N 13/00 349/110 |
| 2015/0309653 | A1 * | 10/2015 | Ho | G06F 3/041 345/174 |
| 2015/0370382 | A1 * | 12/2015 | Hsu | G06F 3/0445 345/174 |
| 2016/0155967 | A1 | 6/2016 | Lee et al. | |
| 2016/0202782 | A1 * | 7/2016 | Park | G06F 1/1652 345/173 |
| 2016/0223722 | A1 * | 8/2016 | Ahn | G02B 1/14 |
| 2016/0282661 | A1 | 9/2016 | Nam | |
| 2016/0372701 | A1 * | 12/2016 | Kwon | H10K 59/877 |
| 2017/0069692 | A1 | 3/2017 | Lee | |
| 2017/0133436 | A1 | 5/2017 | Wang | |
| 2017/0243927 | A1 | 8/2017 | Jeong et al. | |
| 2017/0338286 | A1 * | 11/2017 | Oh | G06F 3/0412 |
| 2017/0373281 | A1 * | 12/2017 | Park | H10K 50/86 |
| 2018/0061893 | A1 | 3/2018 | Breedlove et al. | |
| 2018/0122836 | A1 | 5/2018 | Kang et al. | |
| 2018/0166507 | A1 | 6/2018 | Hwang et al. | |
| 2018/0222236 | A1 * | 8/2018 | Morozumi | B41M 5/00 |
| 2018/0301660 | A1 * | 10/2018 | Liu | B32B 5/22 |
| 2018/0350890 | A1 * | 12/2018 | Jeong | H10K 59/131 |
| 2018/0361652 | A1 * | 12/2018 | Matusik | B29C 64/124 |
| 2018/0374906 | A1 | 12/2018 | Everaerts et al. | |
| 2019/0115411 | A1 * | 4/2019 | Park | H10K 59/8792 |
| 2019/0173051 | A1 * | 6/2019 | Bu | H10K 85/141 |
| 2019/0350092 | A1 | 11/2019 | Jung et al. | |
| 2019/0361555 | A1 * | 11/2019 | Lee | H10K 59/122 |
| 2020/0116899 | A1 * | 4/2020 | Eo | H04M 1/0268 |
| 2020/0161590 | A1 * | 5/2020 | Seo | H10K 59/8792 |
| 2020/0285337 | A1 * | 9/2020 | Lee | G06F 3/0446 |
| 2020/0295310 | A1 | 9/2020 | Moon et al. | |
| 2020/0386917 | A1 * | 12/2020 | Hashimoto | H10K 50/844 |
| 2021/0111357 | A1 * | 4/2021 | Kawaguchi | G09F 9/30 |
| 2021/0173517 | A1 * | 6/2021 | Li | H10K 59/8731 |
| 2021/0193956 | A1 | 6/2021 | Zhao | |
| 2021/0234120 | A1 * | 7/2021 | Zhang | H10K 71/00 |
| 2021/0242600 | A1 | 8/2021 | Liu et al. | |
| 2021/0361555 | A1 | 11/2021 | Kergosien | |
| 2021/0405781 | A1 * | 12/2021 | Li | H10K 59/8791 |

FOREIGN PATENT DOCUMENTS

| | | | | |
|---|---|---|---|---|
| CN | 107545848 | | 1/2018 | |
| CN | 107807468 A | * | 3/2018 | G02F 1/133528 |
| CN | 107980155 | | 5/2018 | |
| CN | 108099282 | | 6/2018 | |
| CN | 108922406 A | * | 11/2018 | G09F 9/301 |
| CN | 208428776 U | | 1/2019 | |
| KR | 1020180099743 | | 9/2018 | |

OTHER PUBLICATIONS

Final Office Action for related U.S. Appl. No. 16/959,039, dated Mar. 23, 2022.

Non-Final Office Action for related U.S. Appl. No. 16/959,039, dated Dec. 15, 2021.

English translation of International Search Report and Written Opinion for related International Application No. PCT/CN2019/101403, dated May 26, 2020.

Extended European Search Report for corresponding European Application No. 19942005.0, dated Sep. 12, 2022.

Extended European Search Report for corresponding European Application No. 24160453.7, dated Jul. 3, 2024. 8 pages.

* cited by examiner

FLEXIBLE DISPLAY APPARATUS AND FABRICATION METHOD THEREOF

This application is a continuation in part of U.S. Ser. No. 16/959,039 filed on Jun. 29, 2020, which is a U.S. National Phase Entry of International Application No. PCT/CN2019/101403 filed on Aug. 19, 2019, and the entire disclosure of which is incorporated herein by reference as part of the present application.

TECHNICAL FIELD

At least one embodiment of the present disclosure relates to a flexible display apparatus and a fabrication method thereof.

BACKGROUND

At present, a market share of flexible display apparatuses is increasing. A flexible display apparatus mainly includes an organic light emitting diode display apparatus having curlability and foldability. The flexible display apparatus having folding performance can also be referred to as a foldable display apparatus, of which a folding radius is required to reach 3 mm, or even 1 mm Such a bending condition not only has a relatively high requirement on bending tolerance for a light-emitting device itself in the display apparatus, but also has a very high requirement on bending tolerance for a polarizer sheet, optical adhesive, and a cover plate, etc.

SUMMARY

At least one embodiment of the present disclosure provide a flexible display apparatus and a fabrication method thereof. The flexible display apparatus include a display panel and a cover plate layer located on a display side of the display panel. The cover plate layer includes a first cover plate layer and a second cover plate layer stacked; the second cover plate layer is located on a side of the first cover plate layer that is closer to the display panel; the first cover plate layer includes a first flexible cover plate layer and a hardened layer located on a side of the first flexible cover plate layer that is away from the display panel; and the second cover plate layer includes a second flexible cover plate layer, and a material of the second flexible cover plate layer includes glass.

In some examples, the second cover plate layer further includes a third flexible cover plate layer, located on a side of the second flexible cover plate layer away from the first flexible cover plate layer.

In some examples, a material of at least one of the first flexible cover plate layer and the third flexible cover plate layer includes one or more of a flexible polymer layer and ultra-thin glass.

In some examples, the flexible polymer layer includes polyimide, polyethylene naphthalate, polyethylene terephthalate, polymethyl methacrylate, polyurethane and aramid.

In some examples, the material of the first flexible cover plate layer and the material of the third flexible cover plate layer are both polyethylene terephthalate.

In some examples, optical adhesive layers are arranged between adjacent flexible cover layers and on a side of a flexible cover layer closest to the display panel facing the display panel.

In some examples, a thickness of the second flexible cover plate layer is 30 microns to 100 microns.

In some examples, the thickness of the second flexible cover plate layer is 50 microns to 70 microns.

In some examples, a thickness of at least one of the first flexible cover plate layer and the third flexible cover plate layer is 30 microns to 100 microns.

In some examples, a first optical adhesive layer is provided between the first flexible cover plate layer and the second flexible cover plate layer, a second optical adhesive layer is provided between the third flexible cover plate layer and the second flexible cover plate layer; and a surface of the third flexible cover plate layer facing the display panel is provided with a fifth optical adhesive layer; an orthographic projection of the second flexible cover layer and an orthographic projection of the first optical adhesive layer on the display panel completely coincide, the orthographic projection of the second flexible cover layer on the display panel is located within an orthographic projection of the third flexible cover layer on the display panel, and the orthographic projection of the third flexible cover layer on the display panel is located within an orthographic projection of the first flexible cover layer on the display panel.

In some examples, the flexible display apparatus further includes: a touch layer, located between the display panel and the cover plate layer. The touch layer is in direct contact with the display panel.

In some examples, the flexible display apparatus further includes: a polarizer sheet, located between the touch layer and the cover plate layer; and a support layer, located on a side of the display panel that is away from the cover plate layer. The flexible display apparatus includes a neutral layer; and the neutral layer includes the touch layer and at least a part of film layers of the display panel.

In some examples, the display panel is an organic light emitting diode display panel; the organic light emitting diode display panel includes a light-emitting layer and an encapsulation layer covering the light-emitting layer; the touch layer is located on a surface of a side of the encapsulation layer that is away from the light-emitting layer, to be in direct contact with the encapsulation layer; and the neutral layer includes at least one of the light-emitting layer, the encapsulation layer and the touch layer.

In some examples, a third optical adhesive layer is provided between the polarizer sheet and the touch layer; and a fourth optical adhesive layer is provided between the display panel and the support layer.

In some examples, a material of the hardened layer includes acrylic or siloxane-based polymers; and a thickness of the hardened layer is 5 microns to 20 microns.

In some examples, the flexible display apparatus is a foldable display apparatus.

In some examples, the display panel includes a display region and a peripheral region surrounding the display region; a surface of the second flexible cover plate layer that is away from the first flexible cover plate layer is provided with a first ink layer; a surface of the second flexible cover plate layer that faces the first flexible cover plate layer is provided with a second ink layer; the first ink layer and the second ink layer are both located in the peripheral region; and an orthogonal projection of the second ink layer on the display panel overlaps with an orthogonal projection of the first ink layer on the display panel; or the display panel includes a display region and a peripheral region surrounding the display region; a surface of the second flexible cover plate layer that is away from the first flexible cover plate layer is provided with a first ink layer; a surface of the first flexible cover plate layer that faces the second flexible cover plate layer is provided with a second ink layer; the first ink layer and the second ink layer are both located in the peripheral region; and an orthogonal projection of the second ink layer on the display panel overlaps with an orthogonal projection of the first ink layer on the display panel.

In some examples, a thickness of the first ink layer and a thickness of the second ink layer are both 2 microns to 8 microns.

In some examples, a first optical adhesive layer is provided between the first flexible cover plate layer and the second flexible cover plate layer; a second optical adhesive layer is provided on a surface of the second flexible cover plate layer that faces the display panel; a boundary on a side of the first ink layer that is away from the display region is flush with a boundary of the second optical adhesive layer; and a boundary on a side of the second ink layer that is away from the display region is flush with the boundary of the first optical adhesive layer.

In some examples, a shape of the first ink layer is a ring or a strip, and a size of the first ink layer in a direction perpendicular to an extension direction thereof is not greater than 20 mm; a shape of the second ink layer is the same as the shape of the first ink layer, and a size of the second ink layer in a direction perpendicular to an extension direction thereof is not greater than 20 mm.

At least one embodiment of the present disclosure provide a method for fabricating the flexible display apparatus described above, including: forming the display panel, wherein the forming the display panel includes forming a light-emitting layer and an encapsulation layer located on a light emergent side of the light-emitting layer; patterning to form a touch layer on a side of the encapsulation layer that is away from the light-emitting layer; bonding a polarizer sheet with a side of the touch layer that is away from the encapsulation layer; bonding a support layer with a side of the display panel that is away from the touch layer; forming the cover plate layer, wherein the forming the cover plate layer includes bonding a side of the first flexible cover plate layer that is away from the hardened layer with the second flexible cover plate layer.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those ordinarily skilled in the art can obtain other embodiment(s), without any inventive work, which should be within the scope of the present disclosure.

Unless otherwise specified, the technical terms or scientific terms used in the present disclosure should be of general meaning as understood by those ordinarily skilled in the art. In the present disclosure, words such as "first", "second" and the like do not denote any order, quantity, or importance, but rather are used for distinguishing different components. Words such as "include" or "comprise" and the like denote that elements or objects appearing before the words of "include" or "comprise" cover the elements or the objects enumerated after the words of "include" or "comprise" or equivalents thereof, not exclusive of other elements or objects.

In study, the inventors of the present application finds that: a foldable display apparatus having a touch function is generally fabricated with a polymer film layer as a substrate. When the foldable display apparatus is folded, it is easy to cause defects such as disconnection in a touch layer. In order to improve folding performance of a flexible display apparatus, net electrodes included in the touch layer can be directly fabricated on a display panel, omitting a touch substrate and reducing a thickness of the display apparatus. However, as a thickness of a film layer is reduced, ability of the display apparatus to absorb energy impacts is reduced; and thus, the display apparatus itself is more easily destroyed when subjected to impact of an external force, resulting in a shortened service life of the display apparatus.

Figure 1:
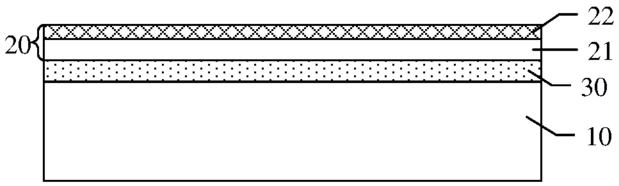
FIG. 1 is a partial sectional structural schematic diagram of a flexible display apparatus.

A cover plate included in a flexible display apparatus mainly adopts a structure of a single flexible polymer thin film plus a hardened layer; and FIG. 1 is a partial sectional structural schematic diagram of the flexible display apparatus. As shown in FIG. 1, the flexible display apparatus includes a display panel 10 and a cover plate 20 located on a display side of the display panel 10. The cover plate 20 includes a flexible polymer thin film 21 and a hardened layer 22 located on a side of the flexible polymer thin film 21 that is away from the display panel 10. Optical adhesive 30 is provided on a side of the flexible polymer thin film 21 that faces the display panel 10. For example, a thickness of the flexible polymer thin film 21 can be 30 microns to 100 microns, and the thickness of the flexible polymer thin film 21 can be, for example, 80 microns; a thickness of the hardened layer 22 may be 5 microns to 20 microns; a thickness of the optical adhesive 30 can be 50 microns to 150 microns, and the thickness of the optical adhesive 30 is, for example, 100 microns.

The thickness of the above-described film layers can be set to ensure that important film layers in the display panel are located in a neutral layer. The neutral layer here refers to, for example, a transition layer in a material; the material includes an outer layer and an inner layer stacked; during bending, the outer layer of the material will be stretched by tension, and the inner layer will be squeezed by pressure; and on a cross section of the material, there will be the transition layer located between the outer layer and the inner layer that is neither subjected to tension nor subjected to pressure, that is, stress of the transition layer is almost equal to zero; and the transition layer is referred to as the neutral layer of the material. The neutral layer has a length unchanged during bending of the material, so it will not be damaged by tension or pressure. The material described here can refer to a foldable display apparatus.

For example, a surface on a side of the hardened layer of the display apparatus including the cover plate as shown in FIG. 1 that is away from the display panel has a pencil hardness of H. In a falling ball impact test, a maximum height of falling ball impact on the display apparatus including the cover shown in FIG. 1 is determined as 6 cm; and in a falling pencil impact test, a maximum height of falling pencil impact on the display apparatus including the cover shown in FIG. 1 is determined as 4 cm. Therefore, the display apparatus including the above-described cover has relatively low pencil hardness and poor impact resistance, which is difficult to meet use requirements.

Embodiments of the present disclosure provide a flexible display apparatus and a fabrication method thereof. The flexible display apparatus includes a display panel and a cover plate layer located on a display side of the display panel. The cover plate layer includes a first cover plate layer and a second cover plate layer stacked; the second cover plate layer is located on a side of the first cover plate layer that is closer to the display panel; the first cover plate layer includes a first flexible cover plate layer and a hardened layer located on a side of the first flexible cover plate layer that is away from the display panel; and the second cover plate layer includes a second flexible cover plate layer, and a material of the second flexible cover plate layer includes glass. The flexible display apparatus provided by the embodiments of the present disclosure has better bending characteristics, pencil hardness, and impact resistance.

Hereinafter, the flexible display apparatus and the fabrication method thereof provided by the embodiments of the present disclosure will be described in conjunction with the accompanying drawings.

Figure 2A:
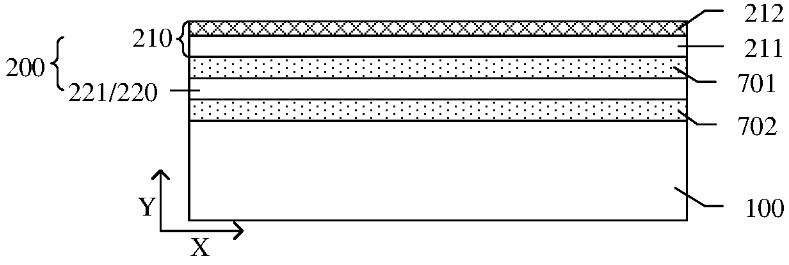
FIG. 2A is a partial sectional structural schematic diagram of a flexible display apparatus provided by an embodiment of the present disclosure.

FIG. 2A is a partial sectional structural schematic diagram of a flexible display apparatus provided by an embodiment of the present disclosure. As shown in FIG. 2A, the flexible display apparatus includes: a display panel 100 and a cover plate layer 200 located on a display side of the display panel 100. The cover plate layer 200 includes a first cover plate layer 210 and a second cover plate layer 220 stacked; the second cover plate layer 220 is located on a side of the first cover plate layer 210 that is closer to the display panel 100; the first cover plate layer 210 includes a first flexible cover plate layer 211 and a hardened layer 212 located on a side of the first flexible cover plate layer 211 that is away from the display panel 100; and the second cover plate layer 220 includes a second flexible cover plate layer 221, and a material of the second flexible cover plate layer 221 includes glass. In the embodiment of the present disclosure, by providing the second flexible cover plate layer between the first flexible cover plate layer and the display panel, the display apparatus including the two flexible cover plate layers can have better bending characteristics, pencil hardness and impact resistance.

For example, the glass includes organic glass, inorganic glass or ultra-thin glass (Ultra Thin Glass, UTG), etc.

For example, the thickness of the glass can be 30 microns to 100 microns. For example, the thickness of the glass can be 70 microns. For example, the glass can be transparent glass with high recovery and ductility.

In some examples, the above-described flexible display apparatus can be a foldable display apparatus.

For example, the foldable display apparatus provided by the embodiment of the present disclosure can be a screen foldable mobile phone; and a foldable display screen included in the screen foldable mobile phone can be folded in the middle of the screen so that the foldable display screen has a folded state and an unfolded state. When the foldable display screen is in the folded state, an area occupied by the screen foldable mobile phone is relatively small, which is convenient for carrying and single hand operation; and when the foldable display screen is in the unfolded state, a display region of the screen foldable mobile phone is relatively large, which has better visual experience and richer functions. Foldable display screens can generally be divided into inwardly foldable display screens and outwardly foldable display screens. The inwardly foldable display screen refers to that a folding direction of the foldable display screen is a light emission direction of the foldable display screen, so that light-emitting surfaces on both sides of a bending region face each other; the outwardly foldable display screen refers to that a folding direction of the foldable display screen is a direction opposite to a light emission direction of the foldable display screen, so that light-emitting surfaces on both sides of a bending region face away from each other.

For example, the cover plate layer 200 provided by the embodiment of the present disclosure is a transparent film layer to transmit image light emitted from the display panel.

In some examples, a thickness of the second flexible cover plate layer 221 is 30 microns to 100 microns, that is, a size of the second flexible cover plate layer 221 in a Y direction is 30 microns to 100 microns.

In some examples, the thickness of the second flexible cover plate layer 221 is 40 microns to 70 microns.

For example, the thickness of the second flexible cover plate layer 221 is 50 microns.

For example, the second flexible cover plate layer 221 may be located only in the display region of the display panel 100 to protect a light-emitting device located in the display region.

For example, the second flexible cover plate layer 221 can be a film layer with a uniform thickness, or can also be a film layer having uniformly distributed openings, which will not be limited in the embodiment of the present disclosure.

For example, an orthogonal projection of the second flexible cover plate layer 221 on the display panel 100 can completely coincide with an orthogonal projection of the first flexible cover plate layer 211 on the display panel 100 to facilitate fabrication of the cover plate layer 200.

For example, the first flexible cover plate layer 211 and the second flexible cover plate layer 221 can entirely cover the display panel 100.

In some examples, a material of the first flexible cover plate layer 211 can includes one or more of a flexible polymer layer and ultra-thin glass, and thus has better bending tolerance.

For example, a material of the first flexible cover plate layer 211 can include one or more of polyimide, polyethylene naphthalate, polyethylene terephthalate, polymethyl methacrylate, polyurethane and aramid.

In some examples, a thickness of the first flexible cover plate layer 211 is 30 microns to 100 microns, that is, a size of the first flexible cover plate layer 211 in the Y direction is 30 microns to 100 microns.

For example, the thickness of the first flexible cover plate layer 211 is 50 microns to 70 microns.

For example, the thicknesses of the first flexible cover plate layer 211 and the second flexible cover plate layer 221 can be the same, to facilitate selection and fabrication of the flexible cover plate layer.

For example, the first flexible cover plate layer 211 and the second flexible cover plate layer 221 can be made of a same flexible material, for example, polyimide, so that both flexible cover plate layers have same bending tolerance.

In some examples, a material of the hardened layer 212 can include acrylic or siloxane-based polymers, and a thickness of the hardened layer 212 is 5 microns to 20 microns to better protect the first flexible cover plate layer 211.

For example, the thickness of the hardened layer 212 can be 10 microns.

In some examples, as shown in FIG. 2A, a first optical adhesive layer 701 is provided between the first flexible cover plate layer 211 and the second flexible cover plate layer 221 to bond the first flexible cover plate layer 211 and the second flexible cover plate layer 221.

In some examples, a thickness of the first optical adhesive layer 701 is 30 microns to 80 microns, that is, a size of the first optical adhesive layer 701 in the Y direction is 30 microns to 80 microns.

For example, the thickness of the first optical adhesive layer 701 is 40 microns to 70 microns.

For example, the thickness of the first optical adhesive layer 701 is 50 microns.

In some examples, as shown in FIG. 2A, a side of the second flexible cover plate layer 221 that faces the display panel 100 is provided with a second optical adhesive layer 702. That is, the second optical adhesive layer 702 is provided on a surface of the second flexible cover plate layer 221 that faces the display panel 100.

In some examples, a thickness of the second optical adhesive layer 702 is 30 microns to 80 microns, that is, a size of the second optical adhesive layer 702 in the Y direction is 30 microns to 80 microns.

For example, the thickness of the second optical adhesive layer 702 is 40 microns to 70 microns.

For example, the thickness of the second optical adhesive layer 702 is 50 microns.

For example, the thicknesses of the first optical adhesive layer 701 and the second optical adhesive layer 702 can be the same.

In the embodiment of the present disclosure, by designing the thicknesses of the respective layers in the cover plate layer and the thicknesses of the respective optical adhesive layers, it can be ensured that the important film layers in the display panel are located in the neutral layer of the flexible display apparatus.

For example, the materials of the first optical adhesive layer 701 and the second optical adhesive layer 702 can include at least one of organic silicone, acrylic resin, unsaturated polyester, polyurethane, and epoxy resin.

For example, a same material or different materials can be selected for the first optical adhesive layer 701 and the second optical adhesive layer 702, which will not be limited in the embodiment of the present disclosure.

For example, elastic modulus of the first optical adhesive layer 701 and the second optical adhesive layer 702 can be 10 KPa to 60 KPa. For example, the elastic modulus of the first optical adhesive layer 701 and the second optical adhesive layer 702 can be 30 KPa to ensure that the display screen of the flexible display apparatus has relatively high pencil hardness. By selecting the elastic modulus of the optical adhesive layers, it can be ensured that the elastic modulus of the optical adhesive layers are moderate, which will neither cause increase in stress on the display panel when the display apparatus is in a bent state because of being too hard, nor affects pencil hardness of the display screen because of being too soft.

In some examples, orthogonal projections of the first flexible cover plate layer 211, the second flexible cover plate layer 221, the first optical adhesive layer 701, and the second optical adhesive layer 702 on the display panel 100 completely coincide with one another.

For example, the above-described cover plate layer and the above-described optical adhesive layers can be formed by cutting with four edges aligned, so that any boundary of the cover plate layer and the optical adhesive layers as described above is flush in the Y direction.

For example, the respective optical adhesive layers can completely cover the display panel 100, or can also have different patterns, for example, be only located at an edge of the display panel, and so on.

Figure 2B:
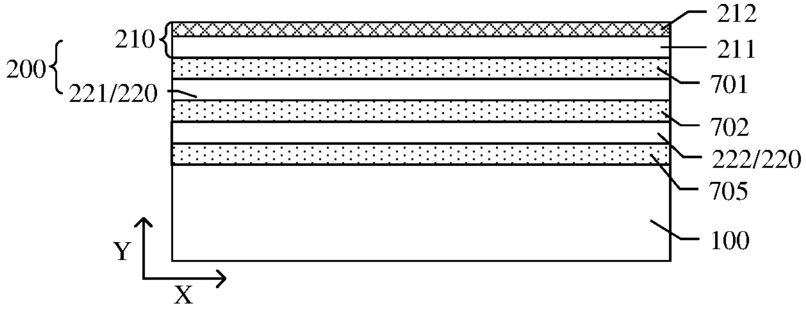
FIG. 2B is a partial sectional structural schematic diagram of a flexible display apparatus provided by another example of an embodiment of the present disclosure.

FIG. 2B is a partial sectional structural schematic diagram of a flexible display apparatus provided by another example of an embodiment of the present disclosure. As illustrated in FIG. 2B, the second cover plate layer 220 further comprises a third flexible cover plate layer 222, located on a side of the second flexible cover plate layer 221 away from the first flexible cover plate layer 211.

For example, a material of at least one of the first flexible cover plate layer 211 and the third flexible cover plate layer 222 includes one or more of a flexible polymer layer and ultra-thin glass.

For example, the flexible polymer layer includes polyimide, polyethylene naphthalate, polyethylene terephthalate, polymethyl methacrylate, polyurethane and aramid.

For example, the material of the second flexible cover plate layer 221 is ultra-thin glass, and materials of the first flexible cover plate layer 211 and the third flexible cover plate layer 222 are both polyethylene terephthalate.

For example, a thickness of at least one of the first flexible cover plate layer 211 and the third flexible cover plate layer 222 is 30 microns to 100 microns.

For example, optical adhesive layers are arranged between adjacent flexible cover layers and on a side of a flexible cover layer closest to the display panel 100 facing the display panel.

For example, an optical adhesive layer, such as the first optical adhesive layer 701, is disposed between the first flexible cover layer 211 and the second flexible cover layer 221. For example, an optical adhesive layer, such as the second optical adhesive layer 702, is disposed between the second flexible cover layer 221 and the third flexible cover layer 222. For example, the side of the third flexible cover layer 222 facing the display panel 100 is provided with an optical adhesive layer, such as the fifth optical adhesive layer 705.

FIG. 2B schematically shows that the cover layer includes the first flexible cover layer, the second flexible cover layer and the third flexible cover layer which are stacked. For example, the cover layer includes three flexible cover layers which are stacked, but not limited thereto. For example, the cover layer may also include four flexible cover layers, five flexible cover layers or more flexible cover layers. For example, the cover layer may include 2 to 20 flexible cover layers. For example, the cover layer may include 3-15 flexible cover layers. For example, the cover layer may include 4-10 flexible cover layers. For example, the cover layer may include 5-8 flexible cover layers.

For example, the material of the flexible cover layer furthest away from the display panel can be organic polymer (the side of the flexible cover layer furthest away from the display panel is provided with the above-mentioned hardened layer), and the materials of other flexible cover layers except the flexible cover layer furthest away from the display panel can be one or more of organic polymer, ultra-thin glass and inorganic substances.

For example, the optical adhesive on a side of the flexible cover layer using ultra-thin glass facing the display panel may include UV viscosity-decreasing adhesive. For example, the UV viscosity-decreasing adhesive can refer to adhesive whose viscosity decreases after irradiation with sufficient amount of ultraviolet light. In the cover layer provided by the embodiment of the present disclosure, upon the ultra-thin glass being damaged, enough ultraviolet rays are irradiated on the UV viscosity-decreasing adhesive bonding the ultra-thin glass with other structures, so that the viscosity of the optical adhesive can be reduced, thereby being beneficial to replacing the damaged ultra-thin glass and improving the utilization rate of products.

For example, at least one optical adhesive layer of the optical adhesive layers between adjacent flexible cover layers and on a side of the flexible cover layer closest to the display panel facing the display panel may include thermoplastic polyurethanes (TPU).

Figure 2C:
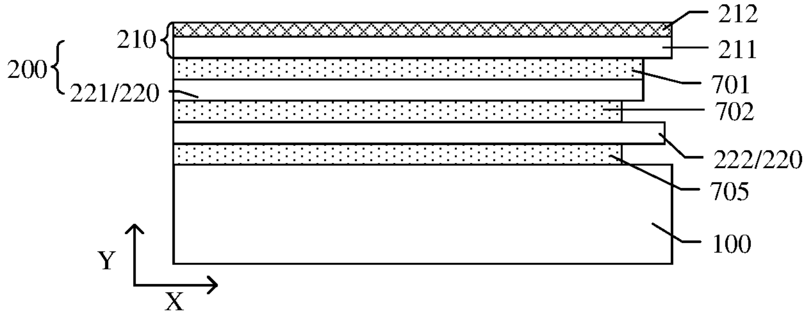
FIG. 2C is a partial sectional structural schematic diagram of a flexible display apparatus provided by another example of an embodiment of the present disclosure.

FIG. 2C is a partial sectional structural schematic diagram of a flexible display apparatus provided by another example of an embodiment of the present disclosure. As illustrated in FIG. 2C, the first optical adhesive layer 701 is disposed between the first flexible cover layer 211 and the second flexible cover layer 221, the second optical adhesive layer 702 is disposed between the second flexible cover layer 221 and the third flexible cover layer 222, and the fifth optical adhesive layer 705 is disposed on the side of the third flexible cover layer 222 facing the display panel 100.

For example, as illustrated in FIG. 2C, an orthographic projection of the second flexible cover layer 221 and an orthographic projection of the first optical adhesive layer 701 on the display panel 100 completely coincide, the orthographic projection of the second flexible cover layer 221 on the display panel 100 is located within an orthographic projection of the third flexible cover layer 222 on the display panel 100, and the orthographic projection of the third flexible cover layer 222 on the display panel 100 is located within an orthographic projection of the first flexible cover layer 211 on the display panel 100.

For example, as illustrated in FIG. 2C, the edges of the second flexible cover layer 221 and the first optical adhesive layer 701 are flush in the direction perpendicular to the display panel 100. For example, a size of the second flexible cover layer 221 in the direction parallel to the display panel 100, such as the size in the X direction, is smaller than that of the third flexible cover layer 222 in this direction. For example, a size of the third flexible cover layer 222 in the direction parallel to the display panel 100, such as the size in the X direction, is smaller than that of the first flexible cover layer 211 in this direction.

Figure 3A:
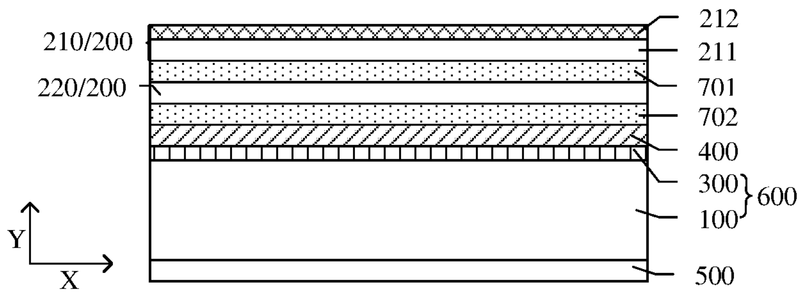
FIG. 3A is a partial sectional structural schematic diagram of another flexible display apparatus provided by an embodiment of the present disclosure.

FIG. 3A is a partial sectional structural schematic diagram of another flexible display apparatus provided by an embodiment of the present disclosure. As shown in FIG. 3A, the flexible display apparatus includes a display panel 100 and a cover plate layer 200 located on a display side of the display panel 100. The cover plate layer 200 includes a first cover plate layer 210 and a second cover plate layer 220 stacked; the second cover plate layer 220 is located on a side of the first cover plate layer 210 that is closer to the display panel 100; the first cover plate layer 210 includes a first flexible cover plate layer 211 and a hardened layer 212 located on a side of the first flexible cover plate layer 211 that is away from the display panel 100; and the second cover plate layer 220 includes a second flexible cover plate layer. A first optical adhesive layer 701 is provided between the first flexible cover plate layer 211 and the second flexible cover plate layer 221; and a surface of the second flexible cover plate layer 221 that faces the display panel 100 is provided with a second optical adhesive layer 702.

The first flexible cover plate layer, the hardened layer, the second flexible cover plate layer, the display panel, the first optical adhesive and the second optical adhesive in the flexible display apparatus shown in FIG. 3A can have same features as the above-described structures shown in FIG. 2A, and no details will be repeated here.

In the embodiment of the present disclosure, by providing the second flexible cover plate layer between the first flexible cover plate layer and the display panel, the display apparatus including the two flexible cover plate layers can have better bending characteristics, pencil hardness and impact resistance.

As shown in FIG. 3A, the flexible display apparatus further includes a touch layer 300 located between the display panel 100 and the cover plate layer 200 to implement a touch function. The touch layer 300 is in direct contact with the display panel 100 (i.e., an on-cell type), that is, the touch layer 300 is directly patterned and formed on the display panel 100, omitting use of a substrate of the touch layer 300, which, thus, may not only improve an integration level of the touch layer and the display panel, but also improve folding performance of the flexible display apparatus.

For example, the touch layer 300 can include a metal grid, and the metal grid includes a plurality of first touch electrodes and a plurality of second touch electrodes. The plurality of first touch electrodes and the plurality of second touch electrodes can form capacitors at overlapping positions; when there is a finger touching, coupling of capacitors near a touch point is affected, thereby changing a capacitance of the capacitor near the touch point; and thus, a touch position can be determined according to the change in capacitance. The embodiment of the present disclosure is not limited thereto, for example, the touch layer can include a mutual-capacitance touch structure, or can include a self-capacitance touch structure. In addition, the touch layer can also be made of a material such as a nano silver wire. Therefore, when the flexible display apparatus is in a folded state, the touch layer made of a material such as a metal grid or a nano silver wire has good bending characteristics, which can avoid breakage, and can also avoid interference with display of the display apparatus as far as possible.

For example, one of the first touch electrode and the second touch electrode can be patterned and formed on the surface of the display panel.

In some examples, as shown in FIG. 3A, the flexible display apparatus further includes a polarizer sheet 400 located between the touch layer 300 and the cover plate layer

200. The polarizer sheet 400 can function to prevent reflection of ambient light, thereby improving display quality of the display apparatus.

For example, the polarizer sheet 400 can be a circular polarizer sheet, for example, can be composed of a linear polarizer sheet and a ¼ wave plate. In some examples, as shown in FIG. 3A, the flexible display apparatus further includes a support layer 500, located on a side of the display panel 100 that is away from the cover plate layer 200.

For example, the display panel 100 according to the embodiment of the present disclosure is a flexible display panel; and the support layer 500 can be a back film to support the display panel 100, and can also better protect the display panel 100.

For example, the support layer 500 can further include a back film and a support plate located on a side of the back film that is away from the display panel 100; and the support plate can further function to support the display panel 100. Moreover, the support layer 500 can also facilitate the flexible display apparatus to restore a flat state after being bent.

For example, the support plate can be a steel sheet, for example, a stainless steel sheet. Since the steel sheet has higher strength and better restore performance, it can better function to support the display panel, and also facilitate the flexible display apparatus to restore a flat state after being bent. Of course, the embodiment of the present disclosure includes but is not limited thereto, and the support plate can also be made of other material suitable for folding characteristics.

For example, when the flexible display apparatus includes a non-bending region and a bending region, the support plate can be provided with a plurality of openings in the bending region, thereby reducing stress during bending. Of course, the embodiment of the present disclosure includes but is not limited thereto, and the support plate can also be a complete plate-like structure.

For example, as shown in FIG. 3A, the flexible display apparatus includes a neutral layer 600; and the neutral layer 600 includes the touch layer 300 and at least a part of film layers of the display panel 100. In the embodiment of the present disclosure, after the two flexible cover plate layers are provided on a light emergent side of the display panel, the thicknesses of the respective layers in the cover plate layer and the thicknesses of the respective optical adhesive layers are designed to ensure that the touch layer can be located in the neutral layer, which, thus, can effectively prevent defects such as breakage of electrodes or traces in the touch layer and some important film layers of the display panel that are caused during folding of the flexible display apparatus.

Figure 3B:
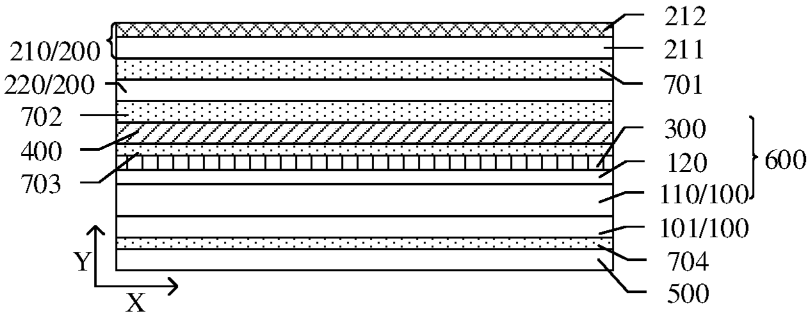
FIG. 3B is a partial sectional structural schematic diagram of another flexible display apparatus provided by an embodiment of the present disclosure.

FIG. 3B is a partial sectional structural schematic diagram of another flexible display apparatus provided by an embodiment of the present disclosure. As shown in FIG. 3B, the flexible display apparatus includes a display panel 100 and a cover plate layer 200 located on a display side of the display panel 100. The cover plate layer 200 includes a first cover plate layer 210 and a second cover plate layer 220 stacked; the second cover plate layer 220 is located on a side of the first cover plate layer 210 that is closer to the display panel 100; the first cover plate layer 210 includes a first flexible cover plate layer 211 and a hardened layer 212 located on a side of the first flexible cover plate layer 211 that is away from the display panel 100; and the second cover plate layer 220 includes a second flexible cover plate layer. A first optical adhesive layer 701 is provided between the first flexible cover plate layer 211 and the second flexible cover plate layer 221; and a surface of the second flexible cover plate layer 221 that faces the display panel 100 is provided with a second optical adhesive layer 702.

The first flexible cover plate layer, the hardened layer, the second flexible cover plate layer, the display panel, the first optical adhesive and the second optical adhesive in the flexible display apparatus shown in FIG. 3B can have same features as the above-described structures shown in FIG. 2A, and no details will be repeated here.

In the embodiment of the present disclosure, by providing the second flexible cover plate layer between the first flexible cover plate layer and the display panel, the display apparatus including the two flexible cover plate layers can have better bending characteristics, pencil hardness and impact resistance.

For example, as shown in FIG. 3B, a third optical adhesive layer 703 is provided between a polarizer sheet 400 and a touch layer 300 to bond the two.

For example, as shown in FIG. 3B, a fourth optical adhesive layer 704 is provided between the display panel 100 and a support layer 500 to bond the two.

For example, the third optical adhesive layer 703 and the fourth optical adhesive layer 704 can be pressure sensitive adhesive (PSA). Of course, the embodiment of the present disclosure includes but is not limited thereto, and the third optical adhesive layer and the fourth optical adhesive layer can also be other adhesive layers.

For example, orthogonal projections of the polarizer sheet 400, the touch layer 300, the display panel 100, the support layer 500, the third optical adhesive layer 703 and the fourth optical adhesive layer 704 on a plane parallel to a main surface of the display panel 100 completely coincide with one another. That is, boundaries of the respective film layers and the optical adhesive layers are aligned with one another.

As shown in FIG. 3B, the display panel 100 is an organic light emitting diode display panel; the organic light emitting diode display panel 100 includes a light-emitting layer 110 and an encapsulation layer 120 covering the light-emitting layer 110, that is, the encapsulation layer 120 is located between the light-emitting layer 110 and the cover plate layer 200; and the encapsulation layer 120 is used for protecting the light-emitting layer 110 from moisture and oxygen in external environment.

For example, as shown in FIG. 3B, the display panel 100 further includes a base 101 located on a side of the light-emitting layer 110 that is away from the encapsulation layer 120, so as to protect a side of the display panel that is away from the cover plate layer.

As shown in FIG. 3B, the touch layer 300 is located on a surface of a side of the encapsulation layer 120 that is away from the light-emitting layer, to be in direct contact with the encapsulation layer 120. That is, the touch layer 300 can be directly patterned and formed on a surface of the encapsulation layer 120. Because the encapsulation layer 120 has a relatively small thickness (e.g., 20 microns), a distance between the touch layer 300 and the light-emitting layer 110 is short. Thus, the neutral layer 600 includes at least one of the light-emitting layer 110, the encapsulation layer 120 and the touch layer 300. For example, a range of the neutral layer of the flexible display apparatus provided by the embodiment of the present disclosure includes the light-emitting layer, the encapsulation layer and the touch layer as described above, which can effectively prevent defects such as breakage occurring to the light-emitting layer, the encapsulation layer and the touch layer during bending of the flexible display apparatus. Of course, the display panel can also be other display panel that can be bent, which will not be limited here in the embodiment of the present disclosure.

For example, a surface on a side of the hardened layer of the flexible display apparatus including the cover plate layer shown in FIG. 2A to FIG. 3B that is away from the display panel has a pencil hardness of 4H. In a falling ball impact test, a maximum height of falling ball impact on the flexible display apparatus including the cover plate layer shown in FIG. 2A to FIG. 3B is determined as 15 cm; and in a falling pencil impact test, a maximum height of falling pencil impact on the display apparatus including the cover shown in FIG. 2A to FIG. 3B is determined as 9 cm. As compared with the display apparatus shown in FIG. 1, the flexible display apparatus provided by the embodiment of the present disclosure has higher pencil hardness, better impact resistance, and better bending performance.

For example, the flexible display apparatus can be an organic light emitting diode flexible display apparatus or a liquid crystal display apparatus, as well as a television, a digital camera, a mobile phone, a watch, a tablet personal computer, a laptop, a navigator, and any other product or component having a display function including the display apparatus, and this embodiment is not limited thereto.

Because structures such as traces provided in a peripheral region of the display panel need to be shielded, it is necessary to provide a light shielding layer on the cover plate located in the peripheral region. For example, the peripheral region of the display panel can include structures such as traces and bonding terminals, and can also include some Gate Driver On Array (GOA) circuits that are set up due to process or load considerations, or a dummy pixel (a pixel not used for display, which, for example, may not have an anode) constituted by an evaporated organic film layer, etc.; and the peripheral region can further include structures such as retaining walls, grooves, or dams used for defining organic layers in the encapsulation layer.

In the display apparatus shown in FIG. 1, a light shielding layer (not shown) surrounding the display region is usually provided on a side of the flexible polymer thin film 21 that faces the display panel 10, that is, the light shielding layer is provided between the flexible polymer thin film 21 and the optical adhesive 30, for example, the light shielding layer can be an ink layer. The ink layer needs to have a good shading effect, for example, an optical density (OD) value thereof is not less than 4 g (1/trans). OD represents an optical density absorbed by a test object, that is, a ratio of incident light intensity to transmitted light intensity, and trans is a light transmission value of the test object. Generally, at least two ink layers (e.g., with a thickness of 10 microns to 12 microns) need to be screen printed to meet the above-described optical density requirements; however, when the ink layer thickness is relatively large, a mismatch between a position where the ink layer is located and other position is relatively large; in this case, the thickness of the optical adhesive also needs to be designed to be larger to bond the cover plate onto the display panel. Therefore, on the one hand, bubbles will be generated during the process of bonding the cover plate onto the display panel; on the other hand, when bending the display apparatus, separation from the optical adhesive or even breakage may occur at the position with the ink layer provided.

Figure 4A:
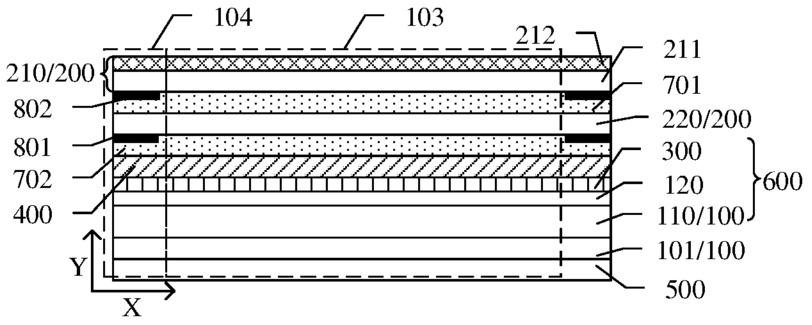
FIG. 4A is a partial sectional structural schematic diagram of another flexible display apparatus provided by an embodiment of the present disclosure.

FIG. 4A is a partial structural schematic diagram of a cross section of another flexible display apparatus provided by an embodiment of the present disclosure. As shown in FIG. 4A, the display panel 100 includes a display region 103 and a peripheral region 104 surrounding the display region 103. The difference from the flexible display apparatus shown in FIG. 3B is that, the display apparatus shown in FIG. 4A further includes an ink layer located in the peripheral region 104. As shown in FIG. 4A, a surface of a second flexible cover plate layer 221 that is away from a first flexible cover plate layer 211 is provided with a first ink layer 801, that is, the first ink layer 801 is located between the second flexible cover plate layer 221 and a second optical adhesive layer 702.

For example, the first ink layer 801 can be a continuous film layer surrounding the display region 103, but it is not limited thereto. In an actual process, the first ink layer can be provided with an opening at a position of a camera, etc.

In some examples, as shown in FIG. 4A, a thickness of the first ink layer 801 is 2 microns to 8 microns, which can reduce a mismatch formed between a position where the first ink layer is located and other region. In this case, the cover plate layer can be attached onto the display panel with the second optical adhesive layer having relatively small thickness, thus preventing bubbles from appearing in optical adhesive or separation from the optical adhesive, or even breakage at the position with the ink layer provided when bending the display apparatus.

For example, the thickness of the first ink layer 801 can be 4 microns to 6 microns, for example, the first ink layer 801 is only one ink layer.

Figure 4B:
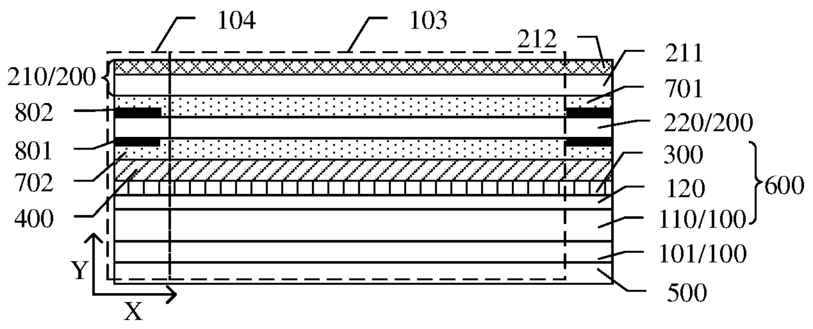
FIG. 4B is a partial sectional structural schematic diagram of another flexible display apparatus provided by an embodiment of the present disclosure.

For example, as shown in FIG. 4A and FIG. 4B, a boundary of the first ink layer 801 that is away from the display region 103 is flush with a boundary of the second optical adhesive layer 702, that is, an outer boundary of the first ink layer 801 and an outer boundary of the second optical adhesive layer 702 are located on a same plane in a Y direction. When orthogonal projections of the first flexible cover plate layer 211, the second flexible cover plate layer 221, the first optical adhesive layer 701, and the second optical adhesive layer 702 on the display panel 100 completely coincide with one another, the outer boundary of the first ink layer 801 is also flush with outer boundaries of the first flexible cover plate layer 211, the second flexible cover plate layer 221, and the first optical adhesive layer 701.

In some examples, as shown in FIG. 4A, a surface of the first flexible cover plate layer 211 that faces the second flexible cover plate layer 221 is provided with a second ink layer 802; the second ink layer 802 is located in the peripheral region 104, and an orthogonal projection of the second ink layer 802 on the display panel 100 overlaps with an orthogonal projection of the first ink layer 801 on the display panel 100. That is, the second ink layer 802 is provided between the first flexible cover plate layer 211 and the first optical adhesive layer 701.

In some examples, as shown in FIG. 4A, the thickness of the second ink layer 802 is 2 microns to 8 microns, which can reduce a mismatch formed between a position where the second ink layer is located and other regions. In this case, the two flexible cover plate layers can be attached together with the first optical adhesive layer having relatively small thickness, which may prevent bubbles from appearing in the optical adhesive or the separation from the optical adhesive, or even breakage at the position where the ink layer is provided when bending the display apparatus, thereby improving bending performance of the display apparatus.

For example, the thickness of the second ink layer 802 can be 4 microns to 6 microns, for example, the second ink layer 802 is only one layer of ink.

For example, a boundary of the second ink layer 802 that is away from the display region 103 is flush with the boundary of the first optical adhesive layer 701, that is, an outer boundary of the second ink layer 802 and the outer boundary of the first optical adhesive layer 701 are located in a same plane in the Y direction. When the orthogonal projections of the first flexible cover plate layer 211, the second flexible cover plate layer 221, the first optical adhesive layer 701, and the second optical adhesive layer 702 on the display panel 100 completely coincide with one another, the outer boundary of the second ink layer 802 is flush with outer boundaries of the first flexible cover plate layer 211, the second flexible cover plate layer 221, and the second optical adhesive layer 702.

For example, the orthogonal projection of the first ink layer 801 on the display panel 100 completely falls within the orthogonal projection of the second ink layer 802 on the display panel 100.

Figure 4C:
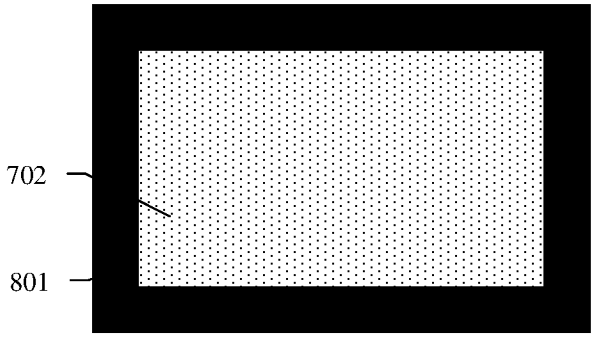
FIG. 4C is a planar structural schematic diagram of a first ink layer according to the embodiment of the present disclosure.

FIG. 4C is a planar structural schematic diagram of the first ink layer according to the embodiment of the present disclosure. In some examples, as shown in FIG. 4C, a shape of the first ink layer 801 can be a ring, but it is not limited thereto, and the shape of the first ink layer can also be a strip. For example, the first ink layer 801 can have a shape of a ring surrounding the display region, or a shape of a strip located only on one side or two opposite sides of the display region. A size of the first ink layer 801 in a direction perpendicular to an extension direction thereof is not greater than 20 mm, that is, a width of the first ink layer 801 is not greater than 20 mm. For example, the width of the first ink layer 801 can be less than 10 mm, or the width of the first ink layer 801 can be 1 mm to 5 mm.

In some examples, a shape of the second ink layer 802 is the same as the shape of the first ink layer 801. That is, when the shape of the first ink layer 801 is a ring, the shape of the second ink layer 802 is also a ring; and when the shape of the first ink layer 801 is a strip, the shape of the second ink layer 802 is also a strip. And a size of the second ink layer 802 in a direction perpendicular to an extension direction thereof is not greater than 20 mm. For example, a width of the second ink layer 802 may be less than 10 mm, or the width of the second ink layer 802 may be 1 mm to 5 mm.

In the embodiment of the present disclosure, by dividing the ink layer shown in FIG. 1 into two layers, which are respectively provided on the two flexible cover plate layers, mismatches formed between positions where the respective ink layers are located and other regions can be reduced in a case where it is ensured that a total optical density of the ink layers provided in the peripheral region is not less than 4, to further prevent bubbles from appearing in the optical adhesive or separation from the optical adhesive, or even breakage at the position where the ink layer is provided when bending the display apparatus, thereby improving bending performance of the display apparatus.

For example, a method for fabricating the display apparatus shown in FIG. 4A includes steps of:

S11: respectively performing single-layer ink printing on a surface of the first flexible cover plate layer that is away from the hardened layer and a surface of the second flexible cover plate layer by screen printing process.

For example, a thickness of the single ink layer formed by the screen printing process in positions of the two flexible cover plate layers that correspond to the peripheral region of the display panel is about 4 microns to 6 microns.

S12: bonding the first optical adhesive layer with the surface of the first flexible cover plate layer provided with the second ink layer by a vacuum bonding process.

S13: bonding the first flexible cover plate layer with the first optical adhesive layer bonded thereto with a surface of the second flexible cover plate layer that is not provided with the first ink layer by a vacuum bonding process.

For example, after the above-described bonding the first flexible cover plate layer with the second flexible cover plate layer is completed, the two cover plate layers are bonded with the display panel through the second optical adhesive layer.

FIG. 4B is a partial sectional structural schematic diagram of another flexible display apparatus provided by an embodiment of the present disclosure. The difference from the flexible display apparatus shown in FIG. 4A is that, a second ink layer 802 of the display apparatus shown in FIG. 4B is provided on a surface of a second flexible cover plate layer 221 that faces a first flexible cover plate layer 211.

In some examples, a thickness of a first ink layer 801 and a thickness of the second ink layer 802 are both 2 microns to 8 microns; and an orthogonal projection of the second ink layer 802 on a display panel 100 overlaps with an orthogonal projection of the first ink layer 801 on the display panel 100.

In the embodiment of the present disclosure, by dividing the ink layer shown in FIG. 1 into two layers, which are respectively provided on surfaces of both sides of the second flexible cover plate layer, mismatches formed between positions where the respective ink layers are located and other regions can be reduced in a case where it is ensured that a total optical density of the ink layers provided in the peripheral region is not less than 4, to further prevent bubbles from appearing in the optical adhesive or separation from the optical adhesive, or even breakage at the position where the ink layer is provided when bending the display apparatus, thereby improving bending performance of the display apparatus.

For example, a method for fabricating the display apparatus shown in FIG. 4B includes steps of:

S21: respectively performing single-layer ink printing on two surfaces of the second flexible cover plate layer by a screen printing process.

For example, a thickness of a single ink layer formed in positions of two surfaces of the second flexible cover plate layer that correspond to the peripheral region of the display panel by the screen printing process is about 4 microns to 6 microns.

S22: bonding the first optical adhesive layer with a surface of the first flexible cover plate layer that is not provided with the hardened layer by a vacuum bonding process.

S23: bonding the first flexible cover plate layer with the first optical adhesive layer bonded thereto with any one surface of the second flexible cover plate layer that is provided with the first ink layer by a vacuum bonding process.

For example, after the above-described bonding the first flexible cover plate layer with the second flexible cover plate layer is completed, the two cover plate layers are attached to the display panel through the second optical adhesive layer, thereby improving bending performance of the display apparatus.

Another embodiment of the present disclosure provides a method for fabricating the flexible display apparatus shown in FIG. 3B, including steps of:

S101: forming a display panel.

For example, the forming a display panel 100 includes forming a light-emitting layer 110 and an encapsulation layer 120 located on a light emergent side of the light-emitting layer 110.

For example, the forming a display panel 100 further includes forming film layers such as a thin film transistor, a cathode and an anode located on both sides of the light-emitting layer, as well as various insulating layers on a base substrate.

S102: patterning to form a touch layer on a side of the encapsulation layer that is away from the light-emitting layer.

For example, a metal layer used for forming the touch layer is deposited on the encapsulation layer, and then patterned to form the desired touch layer. Because the encapsulation layer has a relatively small thickness (e.g., 20 microns), a distance between the touch layer and the light-emitting layer is short. Thus, the neutral layer can include the light-emitting layer, the encapsulation layer, and the touch layer. That is, the range of the neutral layer of the flexible display apparatus provided by the embodiment of the present disclosure includes the light-emitting layer, the encapsulation layer and the touch layer as described above, which can effectively prevent defects such as breakage occurring to the light-emitting layer, the encapsulation layer and the touch layer during bending of the flexible display apparatus.

S103: bonding a polarizer sheet on a side of the touch layer that is away from the encapsulation layer.

For example, the polarizer sheet can be attached onto the touch layer through an optical adhesive layer.

S104: bonding a support layer with a side of the display panel that is away from the touch layer.

For example, the support layer can be bonded onto the display panel through an optical adhesive layer.

For example, in an actual process, the display panel according to this embodiment can be a portion of a large-sized display panel motherboard, that is, the display panel motherboard includes a plurality of display panels. The polarizer sheet and the support layer can also be two structures with a size equivalent to that of the display panel motherboard. After the polarizer sheet and the support layer are attached to both sides of the display panel motherboard, the three are cut with four edges aligned, so that boundaries of the display panel, the polarizer sheet and the support layer formed are flush with one another. The embodiment of the present disclosure is not limited to the above-described method for forming the display panel, and the size of the polarizer sheet and the support layer is not limited to be completely equal to that of the display panel.

S104: forming a cover plate layer.

For example, the forming a cover plate layer includes fabricating the hardened layer on a first flexible cover plate layer, and then bonding a side of the first flexible cover plate layer that is away from the hardened layer with a second flexible cover plate layer through an optical adhesive layer.

For example, a first cover plate layer motherboard (i.e., a film layer including a plurality of first cover plate layers) and a second cover plate layer motherboard (i.e., a film layer including a plurality of second cover plate layers) can be attached together through an optical adhesive layer, and then cut with four edges aligned to form the cover plate layer corresponding to each display panel.

For example, the method further includes bonding a side of the second flexible cover plate layer that is away from the first flexible cover plate layer with the polarizer sheet.

For example, after the above-described cover plate layer is formed, the second flexible cover plate layer in the cover plate layer is bonded to the polarizer sheet through an optical adhesive layer.

The embodiment of the present disclosure is not limited thereto, and after the cover plate layer is bonded to the display panel, the whole can be cut with four edges aligned to form a final display apparatus.

There are some points to be illustrated:

(1) Drawings of the embodiments of the present disclosure only refer to structures related with the embodiments of the present disclosure, and other structures may refer to general design.

(2) In case of no conflict, features in the same embodiment and different embodiments of the present disclosure may be combined with one another.

The foregoing embodiments merely are exemplary embodiments of the present disclosure, and not intended to define the scope of the present disclosure, and the scope of the present disclosure is determined by the appended claims.

The invention claimed is:

1. A flexible display apparatus, comprising:

a display panel and a cover plate layer located on a display side of the display panel, wherein the cover plate layer comprises a first cover plate layer and a second cover plate layer stacked; the second cover plate layer is located on a side of the first cover plate layer that is closer to the display panel; the first cover plate layer comprises a first flexible cover plate layer and a hardened layer located on a side of the first flexible cover plate layer that is away from the display panel; and the second cover plate layer comprises a second flexible cover plate layer, and a material of the second flexible cover plate layer comprises glass;

a first optical adhesive layer is provided between the first flexible cover plate layer and the second flexible cover plate layer, a second optical adhesive layer is provided on a side of the second flexible cover plate layer facing the display panel;

a thickness of the first flexible cover plate layer is 30 microns to 100 microns, a thickness of the second flexible cover plate layer is 30 microns to 100 microns, a thickness of the first optical adhesive layer is 30 microns to 80 microns, a thickness of the second optical adhesive layer is 30 microns to 80 microns, the glass comprises ultra-thin glass, and the second optical adhesive layer comprises UV viscosity-decreasing adhesive; and elastic modulus of the first optical adhesive layer and elastic modulus of the second optical adhesive layer are 10 KPa to 60 KPa.

2. The flexible display apparatus according to claim 1, wherein the second cover plate layer further comprises a third flexible cover plate layer, located on a side of the second flexible cover plate layer away from the first flexible cover plate layer.

3. The flexible display apparatus according to claim 2, wherein a material of at least one of the first flexible cover plate layer and the third flexible cover plate layer comprises one or more of a flexible polymer layer and ultra-thin glass.

4. The flexible display apparatus according to claim 3, wherein the flexible polymer layer comprises polyimide, polyethylene naphthalate, polyethylene terephthalate, polymethyl methacrylate, polyurethane and aramid.

5. The flexible display apparatus according to claim 4, wherein the material of the first flexible cover plate layer and the material of the third flexible cover plate layer are both polyethylene terephthalate.

6. The flexible display apparatus according to claim 5, wherein optical adhesive layers are arranged between adjacent flexible cover layers and on a side of a flexible cover layer closest to the display panel facing the display panel.

7. The flexible display apparatus according to claim 1, wherein the thickness of the second flexible cover plate layer is 50 microns to 70 microns.

8. The flexible display apparatus according to claim 3, wherein a thickness of at least one of the first flexible cover plate layer and the third flexible cover plate layer is 30 microns to 100 microns.

9. The flexible display apparatus according to claim 6, wherein the second optical adhesive layer is provided between the third flexible cover plate layer and the second flexible cover plate layer; and a surface of the third flexible cover plate layer facing the display panel is provided with a fifth optical adhesive layer;

an orthographic projection of the second flexible cover layer and an orthographic projection of the first optical adhesive layer on the display panel completely coincide, the orthographic projection of the second flexible cover layer on the display panel is located within an orthographic projection of the third flexible cover layer on the display panel, and the orthographic projection of the third flexible cover layer on the display panel is located within an orthographic projection of the first flexible cover layer on the display panel.

10. The flexible display apparatus according to claim 1, further comprising:

a touch layer, located between the display panel and the cover plate layer, wherein the touch layer is in direct contact with the display panel.

11. The flexible display apparatus according to claim 10, further comprising:

a support layer, located on a side of the display panel that is away from the cover plate layer, wherein a polarizer sheet is located between the touch layer and the cover plate layer, the flexible display apparatus comprises a neutral layer; and the neutral layer comprises the touch layer and at least a part of film layers of the display panel.

12. The flexible display apparatus according to claim 11, wherein the touch layer is located on a surface of a side of the encapsulation layer that is away from the light-emitting layer, to be in direct contact with the encapsulation layer; and the neutral layer comprises at least one of the light-emitting layer, the encapsulation layer and the touch layer.

13. The flexible display apparatus according to claim 11, wherein a third optical adhesive layer is provided between the polarizer sheet and the touch layer; and a fourth optical adhesive layer is provided between the display panel and the support layer.

14. The flexible display apparatus according to claim 1, wherein a material of the hardened layer comprises acrylic or siloxane-based polymers; and a thickness of the hardened layer is 5 microns to 20 microns.

15. The flexible display apparatus according to claim 1, wherein the flexible display apparatus is a foldable display apparatus.

16. The flexible display apparatus according to claim 1, wherein a thickness of the first ink layer and a thickness of the second ink layer are both 2 microns to 8 microns.

17. The flexible display apparatus according to claim 1, wherein a first optical adhesive layer is provided between the first flexible cover plate layer and the second flexible cover plate layer; a second optical adhesive layer is provided on a surface of the second flexible cover plate layer that faces the display panel; a boundary on a side of the first ink layer that is away from the display region is flush with a boundary of the second optical adhesive layer; and a boundary on a side of the second ink layer that is away from the display region is flush with the boundary of the first optical adhesive layer.

18. A method for fabricating the flexible display apparatus according to claim 1, comprising:

forming the display panel, wherein the forming the display panel comprises forming a light-emitting layer and an encapsulation layer located on a light emergent side of the light-emitting layer;

patterning to form a touch layer on a side of the encapsulation layer that is away from the light-emitting layer;

bonding a polarizer sheet with a side of the touch layer that is away from the encapsulation layer;

bonding a support layer with a side of the display panel that is away from the touch layer;

forming the cover plate layer, wherein the forming the cover plate layer comprises bonding a side of the first flexible cover plate layer that is away from the hardened layer with the second flexible cover plate layer.

19. The flexible display apparatus according to claim 1, wherein a thickness of the hardened layer is 5 microns to 20 microns.

20. The flexible display apparatus according to claim 1, wherein the display panel comprises a display region and a peripheral region surrounding the display region; a surface of the second flexible cover plate layer that is away from the first flexible cover plate layer is provided with a first ink layer; a surface of the second flexible cover plate layer that faces the first flexible cover plate layer is provided with a second ink layer; the first ink layer and the second ink layer are both located in the peripheral region; and an orthogonal projection of the second ink layer on the display panel overlaps with an orthogonal projection of the first ink layer on the display panel; or the display panel comprises a display region and a peripheral region surrounding the display region; a surface of the second flexible cover plate layer that is away from the first flexible cover plate layer is provided with a first ink layer; a surface of the first flexible cover plate layer that faces the second flexible cover plate layer is provided with a second ink layer; the first ink layer and the second ink layer are both located in the peripheral region; and an orthogonal projection of the second ink layer on the display panel overlaps with an orthogonal projection of the first ink layer on the display panel;

the first ink layer and the second ink layer are both light shielding layers;

the display panel is an organic light emitting diode display panel; the organic light emitting diode display panel comprises a light-emitting layer and an encapsulation layer covering the light-emitting layer; the first ink layer and the second ink layer are both located at a side of the encapsulation layer away from the light-emitting layer;

the first ink layer is located between the second flexible cover plate layer and the second optical adhesive layer, the second ink layer is provided between the first flexible cover plate layer and the first optical adhesive layer, and the first ink layer and the second ink layer are both located on a side of a polarizer sheet away from the encapsulation layer.

* * * * *